United States Patent [19]

Ogita et al.

[11] 4,339,826
[45] Jul. 13, 1982

[54] RADIO RECEIVER HAVING PHASE LOCKED LOOP FREQUENCY SYNTHESIZER

[75] Inventors: Minoru Ogita; Shigenobu Kimura, both of Hamamatsu, Japan

[73] Assignee: Nippon Gakki Seizo Kabushiki Kaisha, Hamamatsu, Japan

[21] Appl. No.: 165,091

[22] Filed: Jul. 1, 1980

[30] Foreign Application Priority Data

Jul. 14, 1979 [JP] Japan ................................. 54-89734

[51] Int. Cl.³ .......................... H04B 1/26; H03J 7/28; H03L 7/18
[52] U.S. Cl. ..................................... 455/183; 331/22; 331/31; 455/165
[58] Field of Search ................. 455/183, 182, 165, 76; 331/18, 22, 30, 31

[56] References Cited

U.S. PATENT DOCUMENTS 4,097,805  6/1978  Fujii et al. ............................ 455/76
4,223,406  9/1980  Someno ............................... 455/183

Primary Examiner—Marc E. Bookbinder
Attorney, Agent, or Firm—Frishauf, Holtz, Goodman & Woodward

[57] ABSTRACT

A radio receiver comprises a frequency conversion circuit connected between a frequency-variable local oscillator and a divide-by-N programmable counter incorporated in a phase locked loop frequency synthesizer and adapted to continuously change the frequency to be divided by the programmable counter. Owing to the frequency conversion circuit, the local oscillator frequency is permitted to continuously change in the locked state of the phase locked loop so that the intermediate frequency offset adjustment of receivers, that is, the adjustment of the intermediate frequency of each receiver to the center frequency of an intermediate frequency filter used in the receiver can be made easily, and that a reception of such a broadcast station as having a carrier frequency which is not an integral multiple of a channel spacing frequency also can be made.

5 Claims, 3 Drawing Figures

RADIO RECEIVER HAVING PHASE LOCKED LOOP FREQUENCY SYNTHESIZER

BACKGROUND OF THE INVENTION

This invention relates to a radio receiver comprising a phase locked loop frequency synthesizer for producing a local oscillator frequency signal.

In a phase locked loop frequency synthesizer used in FM radio receivers, as is well known, an output frequency $f_o$ of a voltage-controlled oscillator (VCO) acting as a local oscillator is divided down by a factor of N (an integer) in a programmable counter, an output signal of the programmable counter is compared in phase with a reference frequency signal in a phase comparator, and a control voltage having a magnitude corresponding to a phase difference between the programmable counter output signal and the reference frequency signal is applied to the VCO so that the output frequency of the VCO is stabilized at N times the reference frequency $f_{ref}$. The programmable counter has its dividing factor N changed in increments of one so that the output frequency $f_o$ of the VCO may be changed in, for example, 100 KHz steps, for the reference frequency $f_{ref}$ of 100 KHz or the channel spacing of 100 KHz to permit the radio receiver to search broadcast stations within a frequency band with a channel spacing of 100 KHz.

The radio receivers having such a frequency synthesizer as described above suffer from disadvantages that the adjustment of IF (intermediate frequency) offset and the reception of such a broadcast station as located in Europe and having a carrier frequency which is not an integral multiple of a channel spacing frequency such as of 100 KHz cannot be accurately performed because the local oscillator frequency $f_o$ changes discretely. Namely, because the center frequency of ceramic filters or the like used in radio receivers as the intermediate frequency filter differs from filter to filter it is necessary to adjust the intermediate frequency of each radio receiver to the center frequency of the filter used therein. However, the above described discrete change in the local oscillator frequency makes the proper adjustment of the intermediate frequency of the receivers impossible. As a result, the value N in the programmable counter obtained when the receiver completely tunes to a station would not accurately correspond to the station frequency.

SUMMARY OF THE INVENTION

An object of this invention is to provide an improved radio receiver comprising a phase locked loop frequency synthesizer for producing a local oscillator frequency signal.

Another object of this invention is to provide a radio receiver comprising a phase locked loop frequency synthesizer in which the adjustment of IF offset can be accurately performed.

Still another object of this invention is to provide a radio receiver comprising a phase locked loop frequency synthesizer in which the reception of a broadcast station having a carrier frequency which is not an integral multiple of the channel spacing frequency can be effectively performed.

In accordance with this invention, there is provided, between a frequency-variable local oscillator (first oscillator) whose output frequency is $f_o$ and a divide-by-N programmable counter in a phase locked loop, a frequency conversion circuit adapted to adjust the output frequency $f_o$ of the local oscillator. The frequency conversion circuit may be comprised of a frequency-variable oscillator (second oscillator) whose output frequency $f_x$ can be continuously changed within a frequency range in and near the intermediate frequency $f_i$ of the receiver, preferably a voltage-controlled oscillator; a mixer connected to the first and second oscillators to produce output frequencies representing the sum $(f_o+f_x)$ of and the difference $(f_o-f_x)$ between the output frequencies $f_o$ and $f_x$ of the first and second oscillators; and a bandpass filter connected to the mixer for applying one of the sum output frequency $(f_o+f_x)$ and the difference output frequency $(f_o-f_x)$ from the mixer to the programmable counter. For the lower local system in which a local oscillator frequency is lower than a receiving signal frequency, the bandpass filter is arranged to pass the sum output frequency $(f_o+f_x)$ of the mixer, while, for the upper local system, the filter is arranged to pass the difference output frequency $(f_o-f_x)$.

According to the abovementioned arrangement, a receiving signal frequency $f_r$ of the receiver of the lower local system in the locked condition of the phase locked loop is given by $$f_r = f_o + f_i = N \times f_{ref} + (f_i - f_x)$$

With a receiver of the upper local system, on the other hand, a receiving frequency $f_r$ is given by $$f_r = f_o - f_i = N \times f_{ref} + (f_x - f_i)$$

As evident from the above equations, if the output frequency $f_x$ of the second oscillator is adjusted to the intermediate frequency $f_i$ of the receiver, i.e. the center frequency of an intermediate frequency filter used in the receiver, then the preset value N programmed into the programmable divider permits the receiver to completely tune to a station of the frequency corresponding to the preset value N. If $f_i - f_x$ or $f_x - f_i$ is adjusted to a frequency below the channel spacing frequency, then the receiver is permitted to tune to a broadcast station of a frequency which is not an integral multiple of the channel spacing frequency.

DESCRIPTION OF THE PREFERRED EMBODIMENTS

Figure 1:
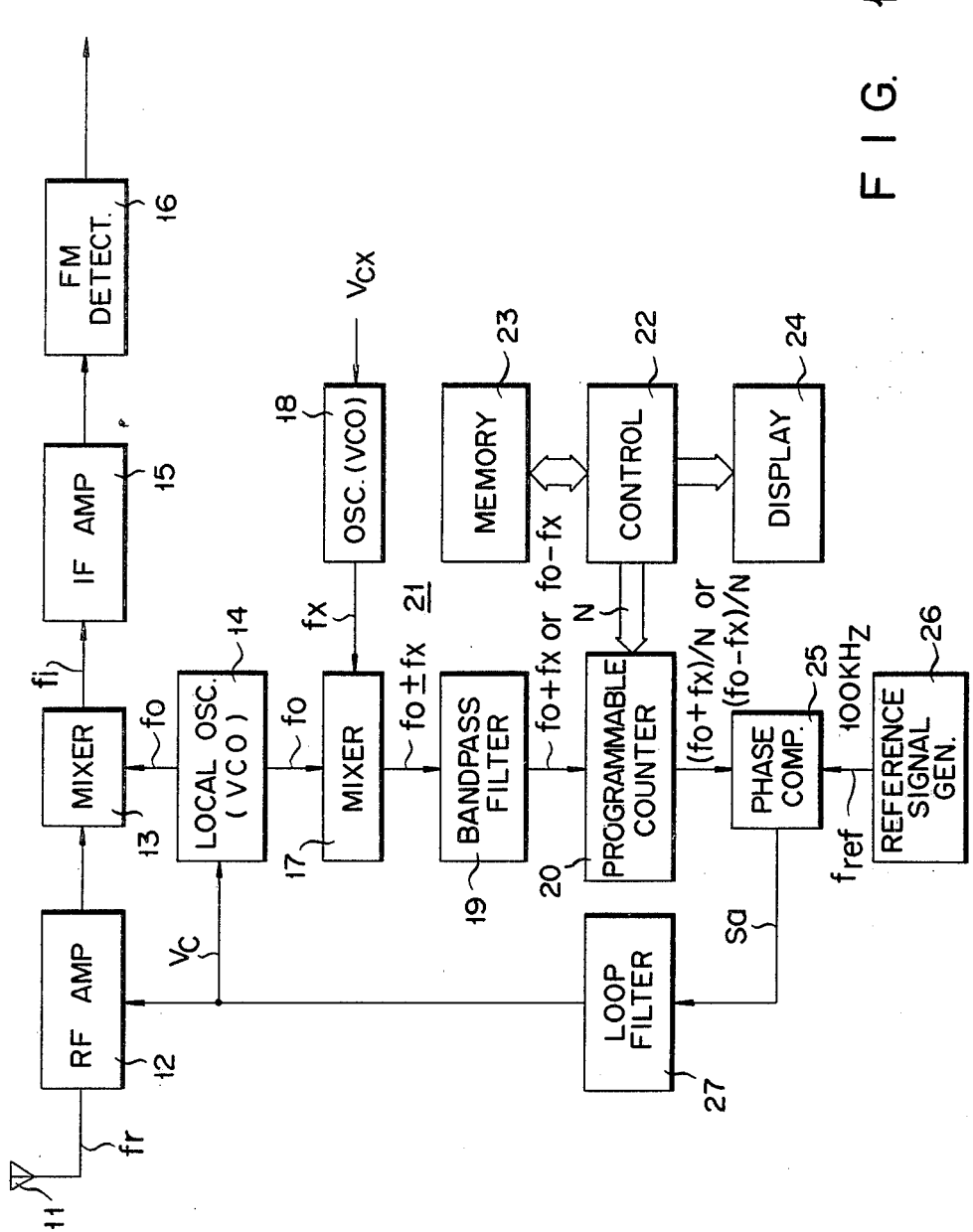
FIG. 1 is a schematic block diagram of a radio receiver according to an embodiment of this invention.

This invention will now be described below in connection with FM radio receivers with reference to the drawings, although this invention can be applied to AM receivers. In FIG. 1, an FM transmission signal received by an antenna 11 is amplifed by an RF amplifier stage 12 and then mixed, in a mixer stage 13, with a local oscillator signal from a local oscillator (frequency-variable oscillator) 14 to produce an intermediate-frequency (IF) FM signal centered at 10.7 MHz. The IF FM signal is amplified by an IF amplifier stage 15 and then applied to an FM detector 16 where transmitted information is recovered.

In this embodiment, the local oscillator 14 consists of a voltage-controlled oscillator (VCO) whose output frequency $f_o$ is controlled by a control voltage Vc applied thereto. A tuned frequency (receiving signal frequency) $f_r$ of the RF amplifier stage 12 is also controlled by the control voltage Vc.

To meet the Japanese FM broadcast standard, the VCO 14 is so designed that its output frequency $f_o$ may vary over a range 65.3 MHz to 79.3 MHz for the allocated FM broadcast frequency band 76.0 MHz to 90.0 MHz with a channel spacing of 100 KHz. To meet the USA FM broadcast standard, on the other hand, the output frequency of the VCO 14 should vary over a range 98.7 MHz to 118.7 MHz for the allocated FM broadcast band 88 MHz to 108 MHz with 100 channels spaced 200 KHz apart.

The output signal of the VCO 14 is also applied to a mixer 17 where it is mixed with an output signal of a frequency $f_x$ of an oscillator 18 to produce output signals of frequencies ($f_o \pm f_x$) representing the sum of and the difference between the output frequencies $f_o$ and $f_x$ of the oscillators 14 and 18. One of the output signals of frequencies ($f_o + f_x$) and ($f_o - f_x$) from the mixer 17 is coupled to a divide-by-N programmable counter 20 through a bandpass filter 19. The mixer 17, oscillator 18 and bandpass filter 19 form a frequency conversion circuit 21 for adjusting the output frequency of the VCO 14. The oscillator 18 is preferably of voltage-controlled type whose output frequency $f_x$ can be changed over a range in and near 10.7 MHz by a control voltage Vcx applied thereto.

The bandpass filter 19 is arranged so as to pass the output frequency ($f_o + f_x$) of the mixer 17 in the lower local system. In the upper local system, on the other hand, the bandpass filter 19 is arranged so as to pass the output frequency ($f_o - f_x$).

The programmable counter 20 divides the output frequency of the bandpass filter 19 by a dividing factor of N, which is programmed by a program input signal applied from a control circuit 22. The control circuit 22 is arranged to load into the programmable counter 20, a desired preset value N stored in a random access memory 23 in a preset station select mode, or a preset value N changing one by one in an automatic station search mode. A numerical value in the programmable counter 20 obtained when a station is received in the automatic station search mode may be stored in the memory 23 through the control circuit 22. The preset value programmed in the programmable counter 20 directly corresponds to the receiving signal frequency and is displayed by a display device 24 to visually indicate the receiving signal frequency. Such a control circuit 22 as described above may be formed of the auto scanner 25 disclosed in FIG. 3A and the auto scan control circuit 66 disclosed in FIG. 3B in the copending U.S. Pat. application Ser. No. 973,631, filed Dec. 27, 1978 now U.S. Pat. No. 4,245,349 and assigned to the same assignee as this application. In this case, the output and input data bus of the memory 23 are connected to the preset input terminals and output terminals of the presettable counters 41 to 43 in the aforesaid U.S. patent application, respectively, and the preset enable terminal of each of the presettable counters 41 to 43 is connected to receive an R/W control signal applied to the memory 23. The counters 41 to 43 are disabled from counting clock pulses by a tuning detection circuit (not shown) connected to the FM detector 16 when the receiver tunes to a station.

The frequency divided output signal of the programmable counter 20 is applied to a phase comparator 25 where it is compared in phase with a reference signal of a frequency $f_{ref} = 100$ KHz from a reference signal generator 26. A comparison output signal Sa of the phase comparator 25 is applied to a loop filter 27 to produce an error voltage having a magnitude corresponding to the phase difference between the frequency divided output signal of the programmable counter 20 and the reference frequency signal, the error voltage being applied to the RF amplifier stage 12 and the VCO 14 as the control voltage Vc.

The local oscillator frequency $f_o$ is caused to vary by the control voltage Vc and stabilized in the phase locked loop lock state in which the output frequency $(f_o \pm f_x)/N$ equals the reference frequency $f_{ref}$(100 kHz). Accordingly, the receiving signal frequency or tuned frequency $f_r$ of the receiver in the lock state of phase locked loop is given by, in the lower local system, $$f_r = f_o + f_i = N \cdot f_{ref} + (f_i - f_x)$$

or in the upper local system, $$f_r = f_o - f_i = N \cdot f_{ref} - (f_i - f_x)$$

As will be evident from the above equations, if the oscillator 18 is adjusted by the control voltage Vcx so that the output frequency $f_x$ becomes equal to an intermediate frequency $f_i$ of the receiver or a center frequency of about 10.7 MHz of the IF filter of the IF amplifier stage 15, then the receiving signal frequency or tuned frequency $f_r$ becomes independent of the center frequency of the IF filter. In other words, when the programmable counter 20 is given a preset value N, the receiver is caused to completely tune to a broadcast station whose frequency directly corresponds to the preset value N. This means that, according to this invention, the adjustment of IF offset of receivers, that is, the adjustment of the intermediate frequency of receivers to the respective center frequencies of IF filters can be easily performed.

With the above arrangement of this invention, the reception of such a broadcast station as having a frequency which is not an integral multiple of 100 KHz, for example, 80.55 MHz can be easily made. To this end, it is only required that, first, the numerical value "805" be programmed into the programmable counter as the preset value, and, second, the frequency $f_x$ of the oscillator 18 be adjusted by the control voltage Vcx so that $f_i - f_x$ or $f_x - f_i$ becomes 50 KHz.

Figure 2:
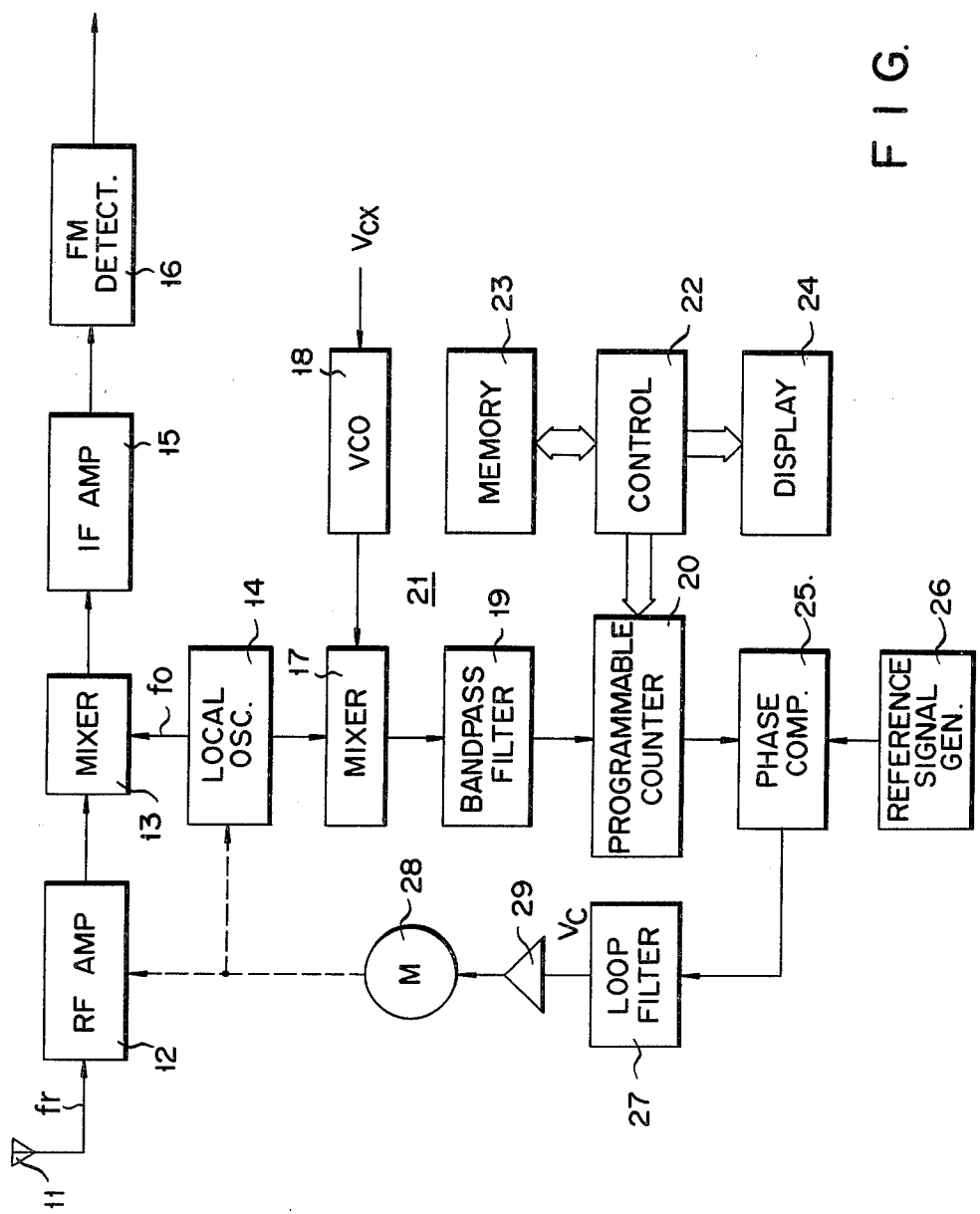
FIG. 2 is a schematic block diagram of a radio receiver according to another embodiment of this invention.

FIG. 2 shows another embodiment of this invention, like reference numerals being used to designate like parts in FIG. 1. In this embodiment, mechanical variable capacitors (not shown) are used in an RF amplifier 12 and a local oscillator 14 to change a tuned frequency $f_r$ and a local oscillator frequency $f_o$. The mechanical variable capacitors are rotated by a motor 28 driven by a motor drive circuit 29 connected to receive a control voltage Vc from a loop filter 27.

Figure 3:
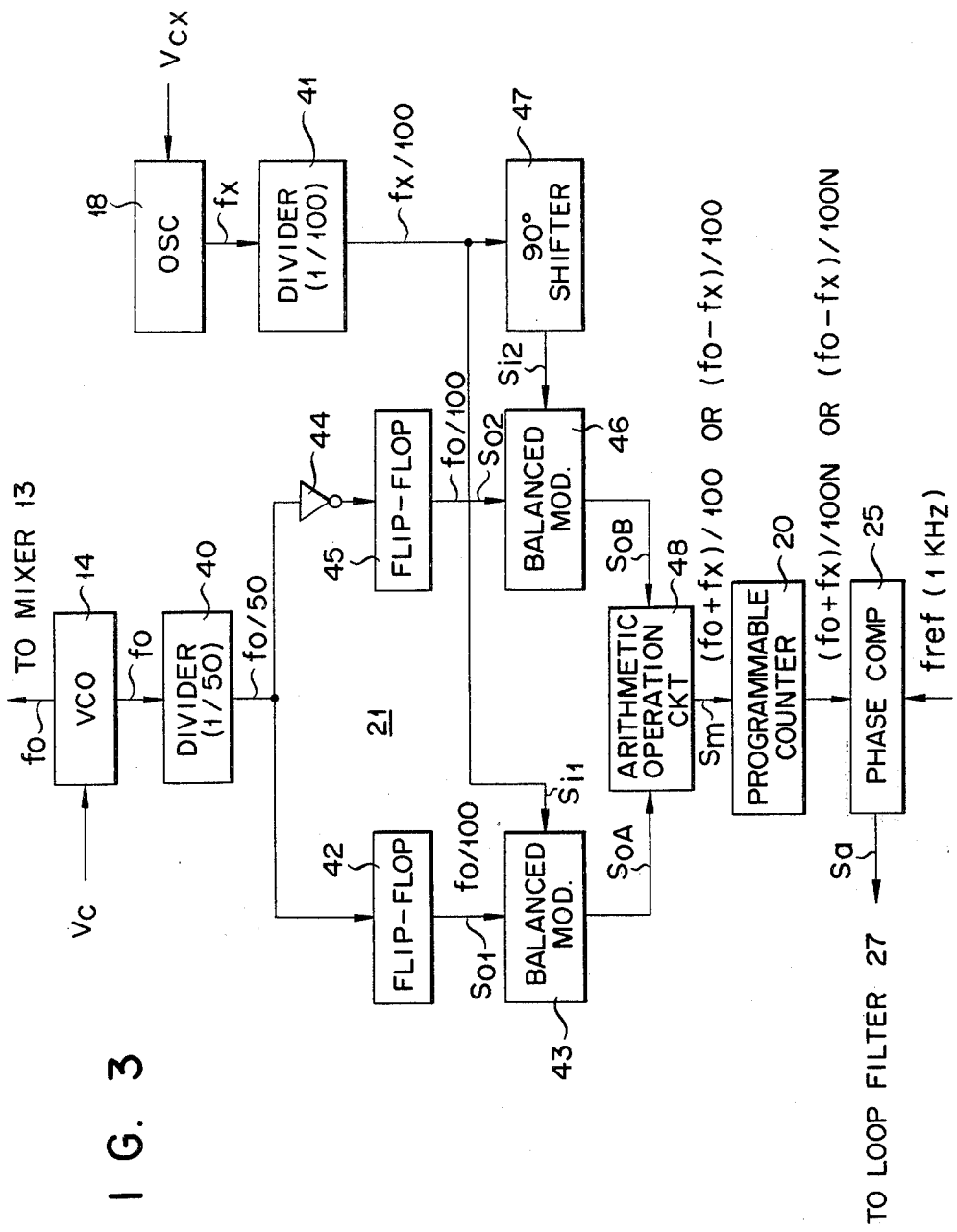
FIG. 3 shows another example of the frequency conversion circuit which may be used in the embodiments of FIGS. 1 and 2.

FIG. 3 shows another embodiment of the frequency conversion circuit 21 which may be used in the receivers of FIGS. 1 and 2. In FIG. 3, the local oscillator output signal is frequency-divided by a frequency divider 40 by a factor of 50, while an output signal of an oscillator 18 is frequency-divided by a frequency divider 41 by a factor of 100. The output signal of the frequency divider 40 is further frequency-divided by a flip-flop circuit 42 by a factor of two, and then applied as a carrier signal S01 to a balanced modulator 43. The output signal of the frequency divider 40 is phase-inverted by an inverter 44 and then applied to a flip-flop circuit 45 to be frequency-divided by a factor of two. The output signal of the flip-flop circuit 45 is applied as a carrier signal So2 to a balanced modulator 46. The output signal of the frequency divider 41 is applied directly to the balanced modulator 43 as a modulation signal Si1 and through a 90° phase shifter 47 to the balanced modulator 46 as a modulation signal Si2. The carrier signals So1 and So2 applied to the balanced modulators 43 and 46 from the flip-flop circuits 42 and 45, respectively, have a frequency of $f_o/100$ and a phase difference of 90° therebetween. On the other hand, the modulation signals Si1 and Si2 applied to the balanced modulators 43 and 46 have a frequency of $f_x/100$ and a phase difference of 90° therebetween.

Assuming that So1=$\sin \omega_o t$, So2=$\cos \omega_o t$, Si1=$Ei \cdot \sin(\omega_i t + \phi_i)$ and Si2=$Ei \cdot \cos(\omega_i t + \phi_i)$, output signals SoA and SoB of the balanced modulators 43 and 46 are represented as follows:

$$SoA = Ei \cdot \sin(\omega_i t + \phi_i) \cdot \sin \omega_o t$$

$$= -\frac{Ei}{2} \{\cos(\omega_i t + \phi_i + \omega_o t) - \cos(\omega_i t + \phi_i - \omega_o t)\}$$

and $$SoB = Ei \cdot \cos(\omega_i t + \phi_i) \cdot \cos \omega_o t$$

$$= -\frac{Ei}{2} \{\cos(\omega_i t + \phi_i + \omega_o t) + \cos(\omega_i t + \phi_i - \omega_o t)\}$$

where $\omega_o = 2\pi f_o/100$ and $\omega_i = 2\pi f_x/100$.

The output signals SoA and SoB of the balanced modulators 43 and 46 are applied to an arithmetic operation circuit 48. The arithmetic operation circuit 48 is arranged to perform substraction (SoB−SoA) between the output signals SoA and SoB of the balanced modulators 43 and 46 in the case of radio receivers of the lower local system, thereby producing an output signal Sm=$Ei \cdot \cos(\omega_i t + \phi_i + \omega_o t)$. In the radio receivers of the upper local system, on the other hand, the arithmetic operation circuit 48 is arranged to perform addition of the output signals SoA and SoB so that the output signal Sm is $Ei \cdot \cos(\omega_o t + \phi_i - \omega_i t)$. The output signal Sm of the arithmetic operation circuit 48 is applied to the programmable counter 20.

The output signal Sm applied to the programmable counter 20 has a frequency of $(f_o + f_x)/100$ or $(f_o - f_x)/100$. Accordingly, if the reference frequency $f_{ref}$ applied to the phase comparator 25 is 1 KHz, the local oscillator frequency $f_o$ can be controlled in the same way as in the embodiment of FIG. 1.

What we claim is:

1. In a radio receiver comprising a phase locked loop frequency synthesizer including a frequency-variable local oscillator for producing a local oscillator signal of a first frequency; a programmable counter for frequency dividing said local oscillator signal; a source of a reference frequency signal; and a phase comparator for comparing in phase a frequency divided output signal of said programmable counter with said reference frequency signal, said phase comparator providing an output coupled to control said frequency-variable local oscillator so as to cause the phase of the frequency divided output signal of said programmable counter to be coincident with the phase of said reference frequency signal;

the improvement comprising:

a first circuit means connected to receive said local oscillator signal of said local oscillator for producing first and second signals having a phase difference of substantially 90° therebetween;

a second oscillator for producing an output signal of a second frequency;

a second circuit means connected to receive said output signal of said second oscillator for producing first and second modulation signals having a phase difference of substantially 90° therebetween;

a first balanced modulator connected to receive said first signal and said first modulation signal for producing a first modulated output signal;

a second balanced modulator connected to receive said second signal and said second modulation signal for producing a second modulated output signal; and an arithmetic operation circuit connected to receive said first and second modulated output signals and generating an output signal, said output signal of said arithmetic operation circuit being supplied to said programmable counter.

2. The radio receiver according to claim 1, wherein said second oscillator is comprised of a frequency-variable oscillator.

3. The radio receiver according to claim 1, wherein said second oscillator comprises a voltage-controlled oscillator.

4. The radio receiver according to claim 1, wherein the output of said arithmetic operation circuit represents a frequency corresponding to a receiving signal frequency and being produced from said first and second modulated output signals.

5. The radio receiver according to claim 1, wherein said frequency-variable local oscillator comprises a voltage-controlled oscillator.

* * * * *